(12) United States Patent
Advincula et al.

(10) Patent No.: US 8,067,825 B2
(45) Date of Patent: Nov. 29, 2011

(54) INTEGRATED CIRCUIT PACKAGE SYSTEM WITH MULTIPLE DIE

(75) Inventors: Abelardo Jr. Hadap Advincula, Singapore (SG); Zigmund Ramirez Camacho, Singapore (SG); Henry Descalzo Bathan, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/863,700

(22) Filed: Sep. 28, 2007

(65) Prior Publication Data

US 2009/0085181 A1    Apr. 2, 2009

(51) Int. Cl.
*H01L 23/495* (2006.01)
(52) U.S. Cl. . 257/676; 257/666; 257/685; 257/E23.031; 257/E21.505; 438/123; 438/107; 438/109
(58) Field of Classification Search .................. 257/666, 257/676, 685, 723, 724, E23.031, E21.505; 438/109, 121–123
See application file for complete search history.

(56) References Cited

U.S. PATENT DOCUMENTS

| | | | |
|---|---|---|---|
| 5,019,893 A * | 5/1991 | Frank et al. | 257/676 |
| 5,084,753 A * | 1/1992 | Goida et al. | 257/685 |
| 6,160,307 A | 12/2000 | Kweon | |
| 6,489,678 B1 * | 12/2002 | Joshi | 257/723 |
| 6,917,097 B2 * | 7/2005 | Chow et al. | 257/666 |
| 6,927,482 B1 | 8/2005 | Kim et al. | |
| 7,145,224 B2 * | 12/2006 | Kawashima et al. | 257/678 |
| 7,157,312 B2 | 1/2007 | Kim et al. | |
| 7,202,554 B1 * | 4/2007 | Kim et al. | 257/686 |
| 7,242,076 B2 | 7/2007 | Dolan | |
| 7,537,965 B2 | 5/2009 | Oman | |
| 2002/0149091 A1 * | 10/2002 | Palmteer et al. | 257/667 |
| 2006/0284290 A1 * | 12/2006 | Cheng | 257/676 |
| 2007/0020802 A1 | 1/2007 | Lee et al. | |

* cited by examiner

*Primary Examiner* — Thinh T Nguyen
(74) *Attorney, Agent, or Firm* — Mikio Ishimaru

(57) ABSTRACT

An integrated circuit package system includes providing die; forming leads adjacent the die; forming a die paddle adjacent the leads with the die thereover; and forming a cavity for isolating one of the die and a die attach segment of the die paddle.

20 Claims, 7 Drawing Sheets

INTEGRATED CIRCUIT PACKAGE SYSTEM WITH MULTIPLE DIE

TECHNICAL FIELD

The present invention relates generally to integrated circuit package systems, and more particularly to a system for multiple die.

BACKGROUND ART

The integrated circuit package is the building block used in an electronic system to provide applications for usage in products such as a personal computer, communications equipment, military devices, industrial robotics, aircraft, and a vast line of consumer products from automotive vehicles to kitchen appliances.

The integrated circuit such as a chip or die is a very tiny and easily damaged device that can be protected with an encapsulant. Even static electricity can be devastating to the very sensitive circuitry of the modern chip or die. Its entire internal contents both functional and physical have protection from damage during normal operating conditions as required by the electronic system in which it is used.

The integrated circuit package is typically mounted and electrically connected to a printed circuit board that is a component in an electronic system. A lead frame is commonly used inside an integrated circuit package to provide many electrical connections between the circuitry within the package and the printed circuit board within the electronic system. Often electrical connections are made with solder balls or bond wires, typically of gold or aluminum material.

The circuitry within a package consists of integrated circuits built onto one side, such as the top, of a piece of semiconductor material such as silicon chip or die. The other side of a silicon chip or die, the bottom for example, is mounted, or typically bonded, with an electrically insulating and thermally conductive die attach layer, such as epoxy onto one side of the die. The opposing die surface is free of any circuitry components such as silicon chips or dice.

The die is typically a semi-rigid electrically and thermally conductive material made of metal used for the handling and manufacturability of the integrated circuit chip or die within the confines of the integrated circuit package. The die often has an "electrical connection" to the circuitry on residing on a silicon chip or die.

There are many industry objectives with regard to integrated circuit packaging. One is for higher circuitry density per area, another is for higher performance, yet another improved reliability, and yet another is for higher profitability as a result of lower unit costs for both the silicon supplier and the electronic systems product producers.

There is a continually growing industry demand for integrated circuit packages containing electrically isolated multiple dies within a single integrated circuit package. This provides for more silicon chips or dice due to the ability to mount more than one chip or die in a single package. For example, an integrated circuit package with multiple chips or dice can have two separated and isolated groups or types of chips or dice within it. An integrated circuit package with four chips or dice can have four separated and isolated groups or types of chips or dice within it.

The practice of producing integrated circuit packages with isolated multiple chips or dice clearly addresses the objectives, namely higher density demands of the electronic industry. Another objective, higher performance, is satisfied by the fact that more than one die is isolated from other die allowing the designers to chose, mix, or match as needed from different chip or dice technologies whether proven, newly developed, or leading edge proprietary.

For those of ordinary skill in the art, are aware of the various beneficial electrical properties such as noise or cross talk reduction that results from having isolated pads within an integrated circuit package. Cost savings can result from higher density and smaller printed circuit boards.

Manufacturers use minimal attachments for multiple die attach surfaces. The minimal attachments suspend the die attach surfaces in the package during assembly. The minimal attachments allow easy separation in the completed package but poor placement control during assembly, encapsulation, or final processing.

Attempts to provide multiple die in an integrated circuit package have failed to solve manufacturability requirements such as reliability, yield, or cost. They have been plagued with unacceptable structural integrity such as issues related to mold bleeding [encapsulation conformance], poor electrical connectivity, or contamination. These issues often lead to early failure or reliability resulting in high costs or low yield.

Thus, a need still remains for an integrated circuit package system to provide improved connectivity, pricing, and dimensions. In view of the increasing demand for improved integrated circuits and particularly more connections in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides die; forming leads adjacent the die; forming a die paddle adjacent the leads with the die thereover; and forming a cavity for isolating one of the die and a die attach segment of the die paddle.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
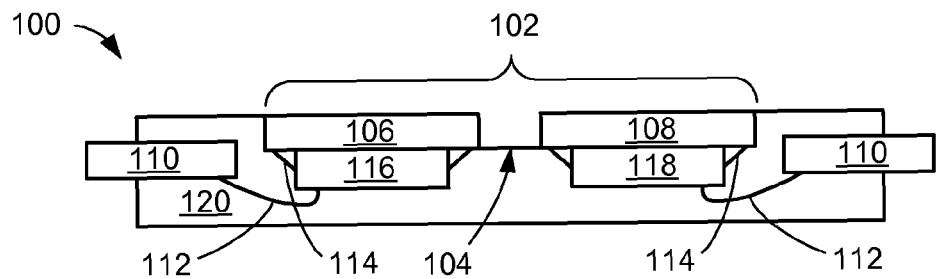
FIG. 1 is a cross-sectional view of an integrated circuit package system taken along line 1-1 of FIG. 2, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
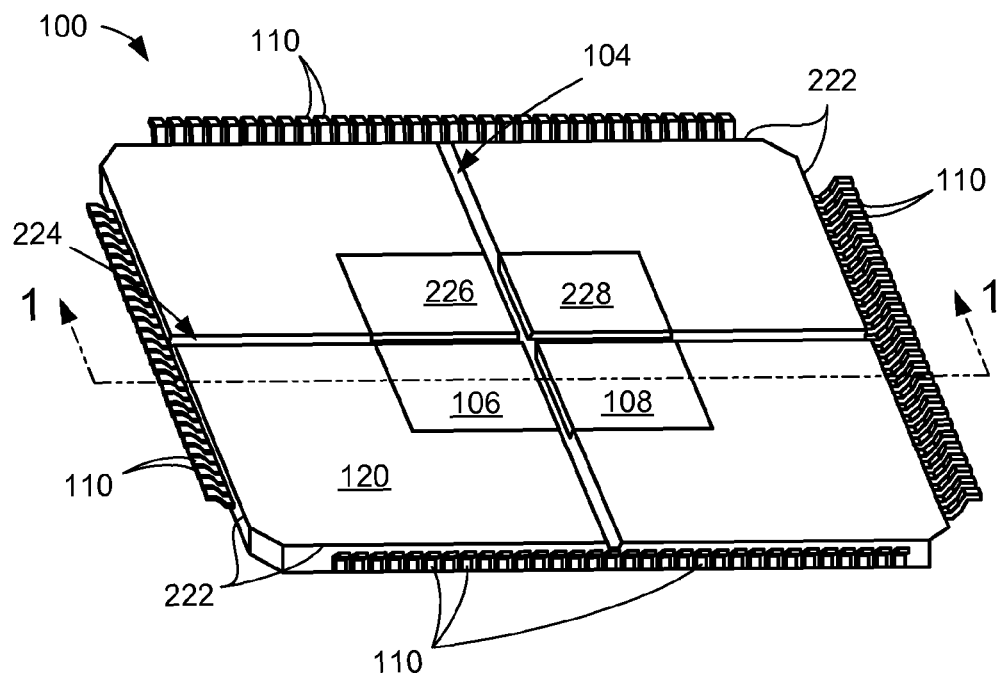
FIG. 2 is a bottom isometric view of the integrated circuit package system.

Referring now to FIG. 1, therein is shown a cross-sectional view of an integrated circuit package system 100 taken along line 1-1 of FIG. 2, in a first embodiment of the present invention. The integrated circuit package system 100 preferably includes a base die paddle 102 having a first cavity 104, a first die attach segment 106, and a second die attach segment 108. The first cavity 104 can separate the first die attach segment 106 and the second die attach segment 108.

The integrated circuit package system 100 includes leads 110 connected with conductive interconnect 112 such as aluminum or copper to connect circuitry (not shown) of a first die 116 such as an integrated circuit die and to connect circuitry (not shown) of a second die 118 such as an integrated circuit die. The surface areas of the first die 116 and the second die 118 over which the conductive interconnect 112 are attached can be referred to as the active surface of the die.

The first die 116 can be attached to the first die attach segment 106 with a die attach layer 114 such as epoxy, silver filled glass, solder, or combination thereof. The second die 118 can be attached to the second die attach segment 108 with the die attach layer 114 that can be of the same or different material.

The first die 116, the second die 118, the conductive interconnect 112, and part of the leads 110 can be covered or sealed with an encapsulant 120 such as an epoxy, silicone, or polyimide based compound providing protection to the integrated circuit package system 100. Part of the leads 110 can be exposed from the encapsulant 120 providing connectivity to the integrated circuit package system 100 and a system application such as a circuit board.

During manufacturing the first die attach segment 106 and the second die attach segment 108 are electrically separated and isolated. An isolation process such as a sawing, drilling, chemical etching, or laser cutting penetrates the bottom side of the integrated circuit package system 100 transversing a bottom surface of the integrated circuit package system 100 and cutting to a predetermined depth to ensure electrically isolation.

It has been unexpectedly discovered that the integrated circuit package system 100 with the base die paddle 102 having electrically isolated individual pad areas per die provides pad support and stability to all pad areas during fabrication and assembly, compatibility with partial saw or drill isolation, and elimination of mold bleeding due to pad tilt or unevenness. The present invention can be applied with both exposed and non-exposed pad packages.

Referring now to FIG. 2, therein is shown a bottom isometric view of the integrated circuit package system 100. The integrated circuit package system 100 also includes outer encapsulant edges 222 of the encansulant 120, the first cavity 104, and a second cavity 224. The first cavity 104 and the second cavity 224 can separate the first die attach segment 106, the second die attach segment 108, a third die attach segment 226, and a fourth die attach segment 228.

The first cavity 104 and the second cavity 224 can extend from one of the outer encapsulant edges 222 to an opposite of the outer encapsulant edges 222 of the base die paddle 102. The first cavity 104 and the second cavity 224 can intersect each other. The first cavity 104 and the second cavity 224 can enable an electrical isolation process such as sawing, drilling, chemical etching, or laser cutting for the first die attach segment 106, the second die attach segment 108, the third die attach segment 226, and the fourth die attach segment 228.

The isolation process can be applied from one of the outer encapsulant edges 222 to another opposite and parallel of the outer encapsulant edges 222. The process can form the first cavity 104 and the second cavity 224 having a predetermined depth for electrical isolation of the dice including the first die attach segment 106 of the base die paddle 102.

For illustrative purposes, the first cavity 104 and the second cavity 224 are shown traversing a length of the encapsulant 120 from one of the outer encapsulant edges 222 to another opposite and parallel of the outer encapsulant edges 222 although it is understood that any number or shape of the first cavity 104 or the second cavity 224 may be used.

A surface of the first die attach segment 106, the second die attach segment 108, the third die attach segment 226, and the fourth die attach segment 228 of the base die paddle 102 can optionally be substantially exposed from the encapsulant 120 or the surface can optionally be covered with the encapsulant 120.

Figure 3:
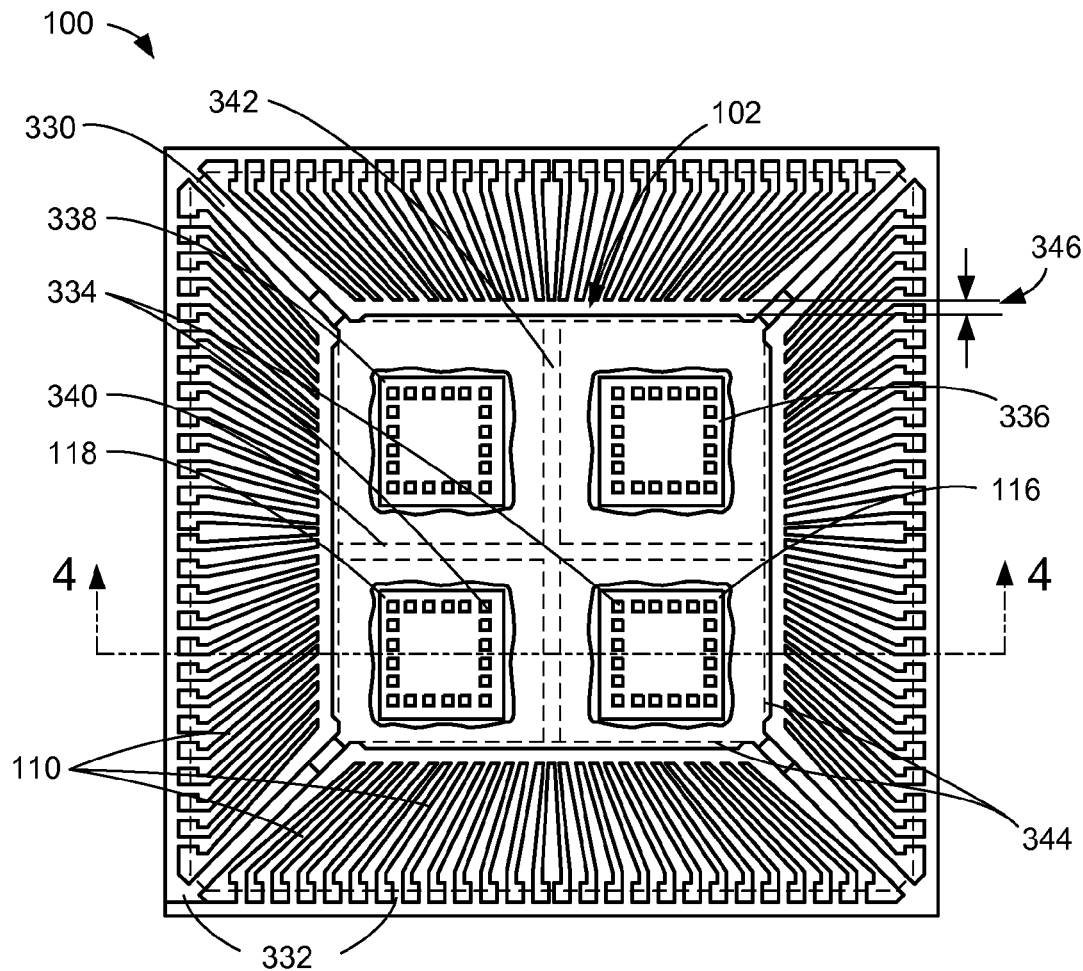
FIG. 3 is a top view of the integrated circuit package system in a mount phase.

Referring to FIG. 3, therein is shown a top view of the integrated circuit package system 100 in a mount phase. The integrated circuit package system 100 also includes tie bars 330, a lead frame perimeter 332, die bonding pads 334, a third die 336, a fourth die 338, a first recess channel 340, a second recess channel 342, and paddle edges 344. The die bonding pads 334 can be used for electrically connecting the first die 116, the second die 118, the third die 336, and the fourth die 338 using the conductive interconnect 112 of FIG. 1.

The leads 110 extend from the lead frame perimeter 332 to near the paddle edges 344 of the base die paddle 102. The leads 110 provide a pre-defined gap 346 from the paddle edges 344 conforming to manufacturing and technology requirements. The pre-defined gap 346 provides clearance so that the conductive interconnect 112 can establish electrical connections to the leads 110 having relatively large dimensions and the die bonding pads 334 on the surfaces of the first die 116, the second die 118, the third die 336, and the fourth die 338.

The first recess channel 340 includes material of the base die paddle 102 removed such as by an etching process. The material removed from the base die paddle 102 can result in a surface indentation of the base die paddle 102 such as the first recess channel 340. Similarly the second recess channel 342 includes material of the base die paddle 102 removed. The material removed from the base die paddle 102 can also result in a surface indentation of the base die paddle 102 such as the second recess channel 342.

The first recess channel 340 or the second recess channel 342 is optional although the first recess channel 340 and the second recess channel 342 can be compatible with isolation processes such as partial saw isolation or partial hole drilling. The first recess channel 340 or the second recess channel 342 can be formed at a predetermined location based on references such as the lead frame perimeter 332, the paddle edges 344 of the base die paddle 102, or the outer encapsulant edges 222 of FIG. 2.

The tie bars 330 can structurally connect the lead frame perimeter 332 to the base die paddle 102 during processing. The first recess channel 340 and the second recess channel 342 can provide an area of reduced material thickness, which can simplify the separation process of the first die attach segment 106, the second die attach segment 108, the third die attach segment 226, and the fourth die attach segment 228 of the base die paddle 102.

Figure 4:
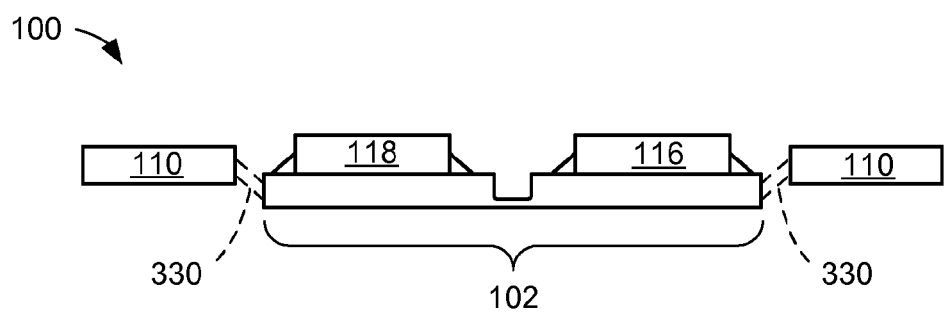
FIG. 4 is a cross-sectional view of the integrated circuit package system taken along line 4-4 of FIG. 3.

Referring to FIG. 4, therein is shown a cross-sectional view of the integrated circuit package system 100 taken along line 4-4 of FIG. 3. The integrated circuit package system 100 includes the base die paddle 102 connected to the leads 110 by the tie bars 330. A plane of the leads 110 and a plane of the lead frame perimeter 332 of FIG. 3 can preferably be formed in a common plane or coplanar.

The base die paddle 102 is substantially planar and adjacent the leads 110. A plane of the base die paddle 102 can be substantially parallel and below a plane of the leads 110. The base die paddle 102 can be suspended below the leads 110 by the tie bars 330. A plane of the first die 116, the second die 118, the third die 336, and the fourth die 338 can be substantially coplanar to the plane of the leads 110 and the lead frame perimeter 332.

Figure 5:
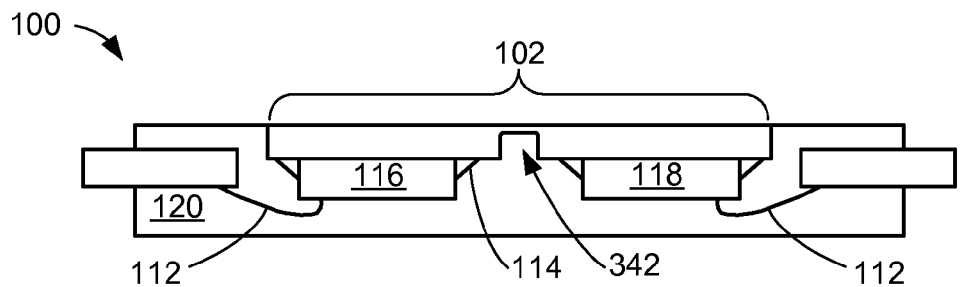
FIG. 5 is a cross-sectional view of the structure of FIG. 1 in an encapsulation phase.

Referring to FIG. 5, therein is shown a cross-sectional view of the structure of FIG. 1 in an encapsulation phase. The integrated circuit package system 100 preferably includes the conductive interconnect 112 connecting the first die 116, the second die 118 and the leads 110 with interconnect processes such as ultrasonic, thermosonic ball, or wedge bonding.

The first die 116, the second die 118, the third die 336, and the fourth die 338 are mounted with the die attach layer 114 to the base die paddle 102 providing substantial planarity precision and control with insensitivity to environment perturbations during connection of the conductive interconnect 112. The planarity precision results in a dramatic reduction in damages from incidents, such as bond fracture, bond lift-off, die passivation cracks, or die fractures.

The base die paddle 102 provides significantly improved structural and thermal qualities for the dice throughout processing. The occurrence of defects such as wire sweep and package cracking due to movement or settling is substantially eliminated. Also substantially eliminated is mold bleeding due to tilting and un-evenness resulting from a lack of support for die paddles.

The integrated circuit package system 100 is shown having surfaces of the first die attach segment 106, the second die attach segment 108, the third die attach segment 226, and the fourth die attach segment 228 substantially exposed without the encapsulant 120. The substantially exposed surfaces can provide significantly improved electrical and thermal performance of the integrated circuit package system 100.

A bottom surface of the integrated circuit package system 100 and optionally exposed dice can be formed substantially coplanar providing significantly reduced processing time and costs. The base die paddle 102 and an improved application of the encapsulant 120 preventing mold bleeding eliminate the need for planar compensation such as through sanding or polishing processes.

The lead frame perimeter 332 of FIG. 3 and exposed portions of the leads 110 can be plated with a material such as tin-lead or nickel-palladium to improve connection contact and assembly characteristics of the integrated circuit package system 100. The lead frame perimeter 332 is preferably removed such as with a cutting process. The exposed portions of the leads 110 can be bent, shaped, or formed as required for a shape, spacing, or other physical characteristic requirement.

Figure 6:
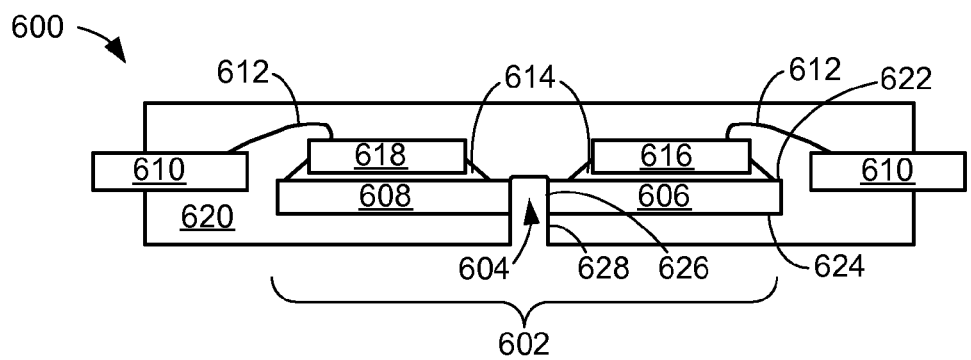
FIG. 6 is a cross-sectional view of an integrated circuit package system in a second embodiment of the present invention.

Referring now to FIG. 6, therein is shown a cross-sectional view of an integrated circuit package system 600 in a second embodiment of the present invention. The integrated circuit package system 600 preferably includes a base die paddle 602 having a package cavity 604, a first die attach segment 606, and a second die attach segment 608. The package cavity 604 can separate the first die attach segment 606 and the second die attach segment 608.

The integrated circuit package system 600 includes leads 610 connected with conductive interconnect 612 such as aluminum or copper to connect circuitry (not shown) of a first die 616 such as an integrated circuit die and to connect circuitry (not shown) of a second die 618 such as an integrated circuit die. The surface areas of the first die 616 and the second die 618 over which the conductive interconnect 612 are attached can be referred to as the active surface of the die.

The first die 616 can be attached to the first die attach segment 606 with a die attach layer 614 such as epoxy, silver filled glass, solder, or combination thereof. The second die 618 can be attached to the second die attach segment 608 with the die attach layer 614 that can be of the same or different material.

The first die 616, the second die 618, the conductive interconnect 612, and part of the leads 610 can be covered or sealed with an encapsulant 620 such as an epoxy, silicone, or polyimide based compound providing protection to the integrated circuit package system 600. Part of the leads 610 can be exposed from the encapsulant 620 providing connectivity to the integrated circuit package system 600 and a system application such as a circuit board.

The encapsulant 620 can be applied over a top paddle surface 622 and a bottom paddle surface 624 of the base die paddle 602. The encapsulant 620 can partially cover the top paddle surface 622 such as mounting surface for the first die 616 or the second die 618 and cover substantially all of the bottom paddle surface 624 adjacent the package cavity 604.

During manufacturing the first die attach segment 606 and the second die attach segment 608 are electrically separated and isolated. An isolation process such as a sawing, drilling, chemical etching, or laser cutting penetrates the bottom side of the integrated circuit package system 600 cutting to a predetermined depth through a thickness of the base die paddle 602 and the encapsulant 620 forming a die paddle cavity 626 and an encapsulant cavity 628.

Figure 7:
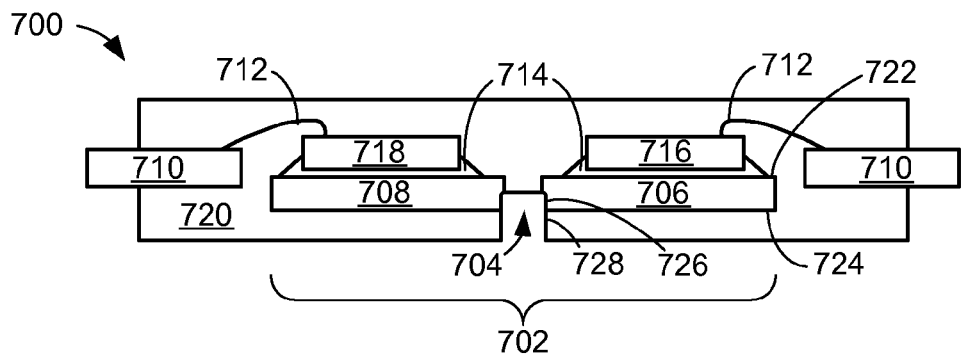
FIG. 7 is a cross-sectional view of an integrated circuit package system in a third embodiment of the present invention

Referring now to FIG. 7, therein is shown a cross-sectional view of an integrated circuit package system 700 in a third embodiment of the present invention. The integrated circuit package system 700 preferably includes a base die paddle 702 having a package cavity 704, a first die attach segment 706, and a second die attach segment 708. The package cavity 704 can separate the first die attach segment 706 and the second die attach segment 708.

The integrated circuit package system 700 includes leads 710 connected with conductive interconnect 712 such as aluminum or copper to connect circuitry (not shown) of a first die 716 such as an integrated circuit die and to connect circuitry (not shown) of a second die 718 such as an integrated circuit die. The surface areas of the first die 716 and the second die 718 over which the conductive interconnect 712 are attached can be referred to as the active surface of the die.

The first die 716 can be attached to the first die attach segment 706 with a die attach layer 714 such as epoxy, silver filled glass, solder, or combination thereof. The second die 718 can be attached to the second die attach segment 708 with the die attach layer 714 that can be of the same or different material.

The first die 716, the second die 718, the conductive interconnect 712, and part of the leads 710 can be covered or sealed with an encapsulant 720 such as an epoxy, silicone, or polyimide based compound providing protection to the integrated circuit package system 700. Part of the leads 710 can be exposed from the encapsulant 720 providing connectivity to the integrated circuit package system 700 and a system application such as a circuit board.

The encapsulant 720 can be applied over a top paddle surface 722 and a bottom paddle surface 724 of the base die paddle 702. The encapsulant 720 can partially cover the top paddle surface 722 such as mounting surface for the first die 716 or the second die 718 and cover substantially all of the bottom paddle surface 724 adjacent the package cavity 704.

During manufacturing the first die attach segment 706 and the second die attach segment 708 are electrically separated and isolated. An isolation process such as a sawing, drilling, chemical etching, or laser cutting penetrates the bottom side of the integrated circuit package system 700. The package cavity 704 can be formed to a predetermined depth near the top paddle surface 722 as well as through the encapsulant 720 and the bottom paddle surface 724 forming a die paddle cavity 726 and an encapsulant cavity 728.

Figure 8:
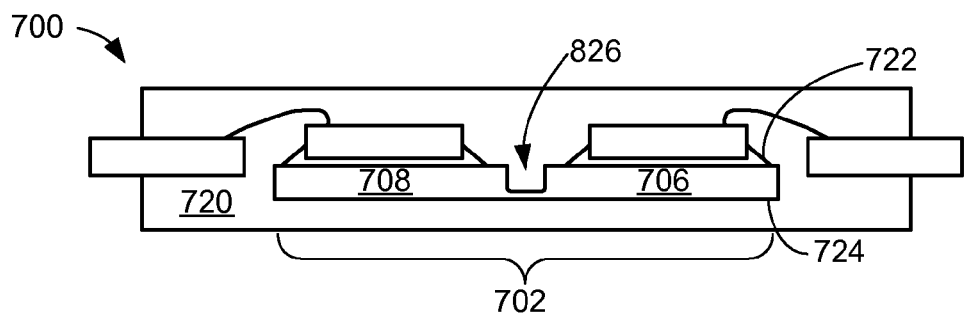
FIG. 8 is a cross-sectional view of the structure of FIG. 7 in an encapsulation phase.

Referring now to FIG. 8, therein is shown a cross-sectional view of the structure of FIG. 7 in an encapsulation phase. The integrated circuit package system 700 preferably includes the top paddle surface 722 having a paddle cavity 826. The encapsulant 720 can be formed over the base die paddle 702 having the first die attach segment 706, the second die attach segment 708 and the paddle cavity 826.

The paddle cavity 826 can be formed in a predetermined location adjacent the first die attach segment 706 and the second die attach segment 708. A depth of the paddle cavity 826 can be predetermined to improve formation of the package cavity 704 of FIG. 7. The paddle cavity 826 can be formed in a shape such as a hole, a channel, or combination thereof enabling electrical isolation of the first die attach segment 706 and the second die attach segment 708.

Figure 9:
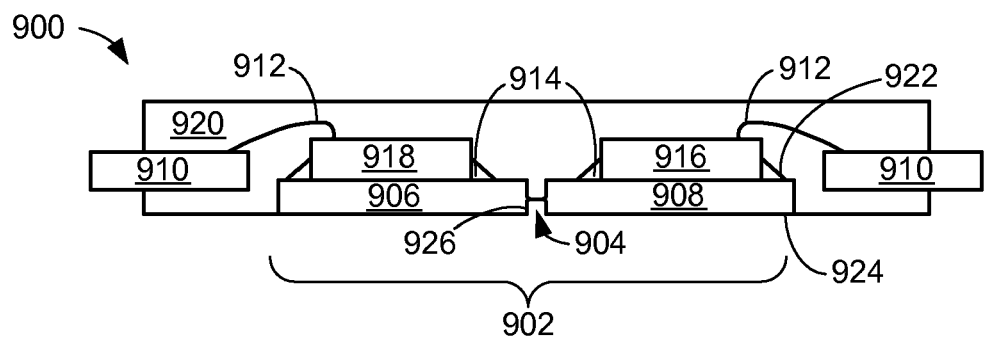
FIG. 9 is a cross-sectional view of an integrated circuit package system in a fourth embodiment of the present invention.

Referring now to FIG. 9, therein is shown a cross-sectional view of an integrated circuit package system 900 in a fourth embodiment of the present invention. The integrated circuit package system 900 preferably includes a base die paddle 902 having a package cavity 904, a first die attach segment 906, and a second die attach segment 908. The package cavity 904 can separate the first die attach segment 906 and the second die attach segment 908.

The integrated circuit package system 900 includes leads 910 connected with conductive interconnect 912 such as aluminum or copper to connect circuitry (not shown) of a first die 916 such as an integrated circuit die and to connect circuitry (not shown) of a second die 918 such as an integrated circuit die. The surface areas of the first die 916 and the second die 918 over which the conductive interconnect 912 are attached can be referred to as the active surface of the die.

The first die 916 can be attached to the first die attach segment 906 with a die attach layer 914 such as epoxy, silver filled glass, solder, or combination thereof. The second die 918 can be attached to the second die attach segment 908 with the die attach layer 914 that can be of the same or different material.

The first die 916, the second die 918, the conductive interconnect 912, and part of the leads 910 can be covered or sealed with an encapsulant 920 such as an epoxy, silicone, or polyimide based compound providing protection to the integrated circuit package system 900. Part of the leads 910 can be exposed from the encapsulant 920 providing connectivity to the integrated circuit package system 900 and a system application such as a circuit board.

The encapsulant 920 can be applied over a top paddle surface 922 of the base die paddle 902 having a bottom paddle surface 924 of the base die paddle 902 substantially exposed. The encapsulant 920 can partially cover the top paddle surface 922 such as mounting surface for the first die 916 or the second die 918 and be formed adjacent the bottom paddle surface 924.

During manufacturing the first die attach segment 906 and the second die attach segment 908 are electrically separated and isolated. An isolation process such as a sawing, drilling, chemical etching, or laser cutting penetrates the bottom side of the integrated circuit package system 900. The package cavity 904 can be formed to a predetermined depth near the top paddle surface 922 as well as through the bottom paddle surface 924 forming a die paddle cavity 926.

Figure 10:
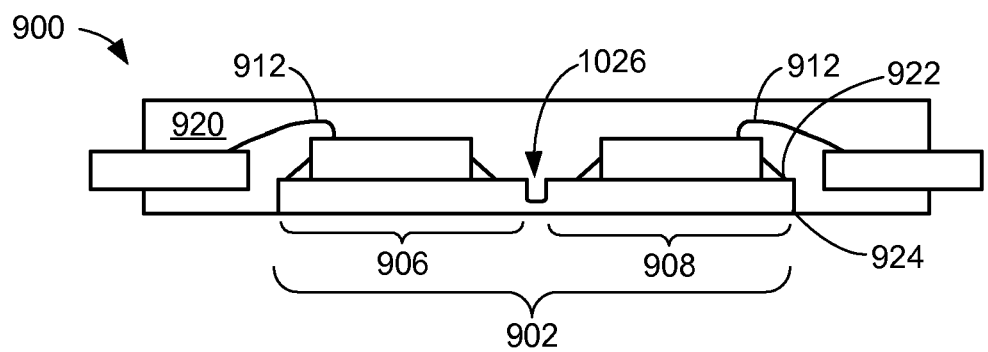
FIG. 10 is a cross-sectional view of the structure of FIG. 9 in an encapsulation phase.

Referring now to FIG. 10, therein is shown a cross-sectional view of the structure of FIG. 9 in an encapsulation phase. The integrated circuit package system 100 preferably includes the top paddle surface 922 having a paddle cavity 1026. The encapsulant 920 can be formed over the base die paddle 902 having the first die attach segment 906, the second die attach segment 908 and the paddle cavity 1026.

The paddle cavity 1026 can be formed in a predetermined location adjacent the first die attach segment 906 and the second die attach segment 908. A depth of the paddle cavity 1026 can be predetermined to improve formation of the package cavity 904 of FIG. 9. The paddle cavity 1026 can be formed in a shape such as a hole, a channel, or combination thereof enabling electrical isolation of the first die attach segment 906 and the second die attach segment 908.

Figure 11:
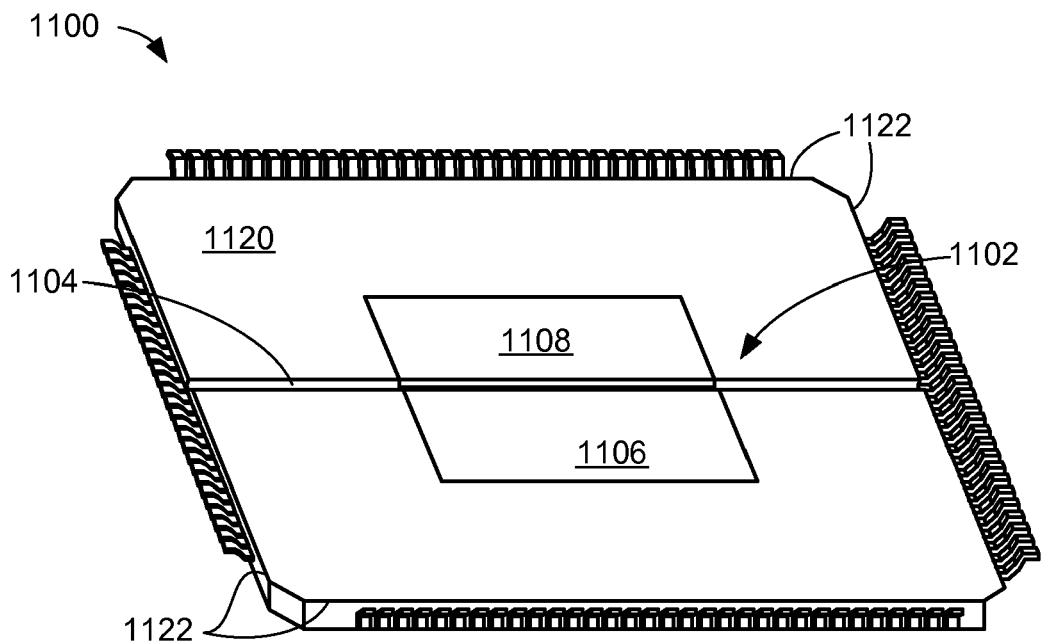
FIG. 11 is a bottom isometric view of an integrated circuit package system in a fifth embodiment of the present invention.

Referring now to FIG. 11, therein is shown a bottom isometric view of an integrated circuit package system 1100 in a fifth embodiment of the present invention. The integrated circuit package system 1100 preferably includes a base die paddle 1102 having a cavity 1104, a first die attach segment 1106, and a second die attach segment 1108. The cavity 1104 can separate the first die attach segment 1106 and the second die attach segment 1108.

The integrated circuit package system 1100 also includes outer encapsulant edges 1122 of the integrated circuit package system 1100 and the cavity 1104. The cavity 1104 can separate the first die attach segment 1106 and the second die attach segment 1108.

The cavity 1104 can extend from one of the outer encapsulant edges 1122 to an opposite of the outer encapsulant edges 1122 of the base die paddle 1102. The cavity 1104 can enable an electrical isolation process such as sawing, drilling, chemical etching, or laser cutting for the first die attach segment 1106 and the second die attach segment 1108.

The isolation process can be applied from one of the outer encapsulant edges 1122 to another opposite and parallel of the outer encapsulant edges 1122. The process can form the cavity 1104 having a predetermined depth for electrical isolation of the dice including the first die attach segment 1106 of the base die paddle 1102.

For illustrative purposes, the cavity 1104 is shown traversing a length of an encapsulant 1120 from one of the outer encapsulant edges 1122 to another opposite and parallel of the outer encapsulant edges 1122 although it is understood that any number or shape of the cavity 1104 may be used.

A surface of the first die attach segment 1106 of the base die paddle 1102 can optionally be substantially exposed from the encapsulant 1120 or the surface can optionally be covered with the encapsulant 1120.

Figure 12:
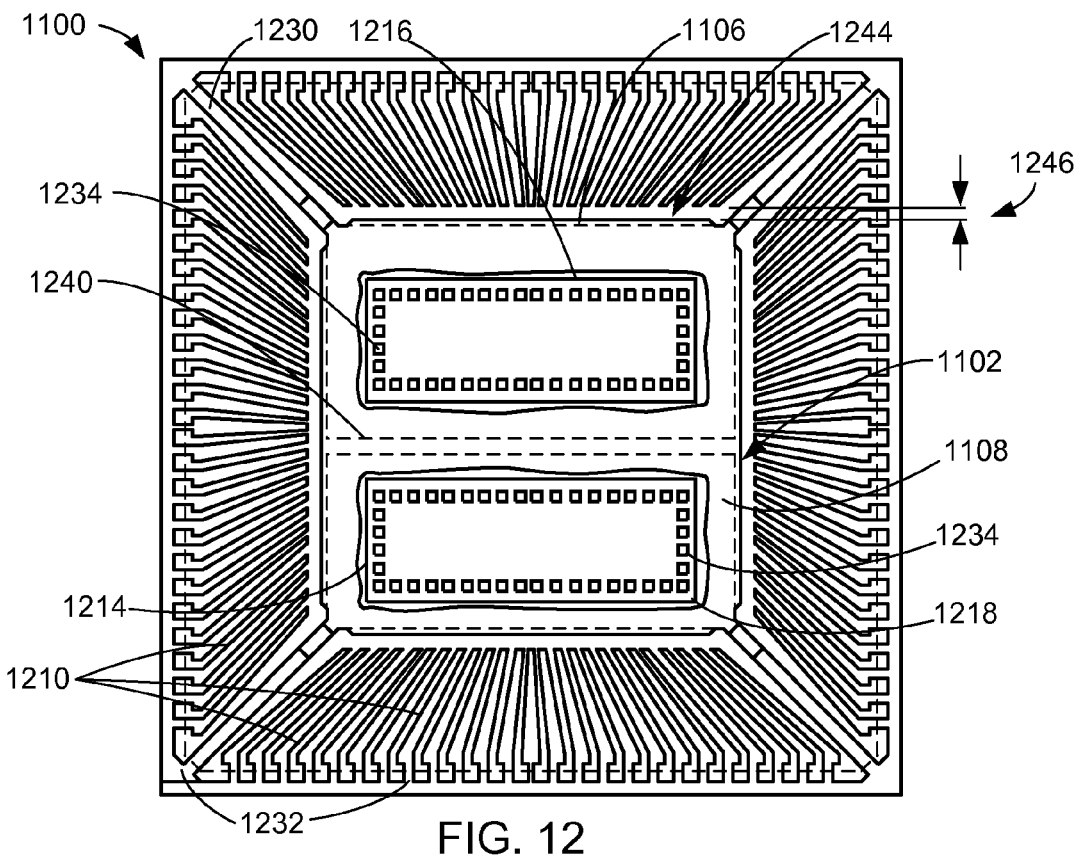
FIG. 12 is a plan view of the structure of FIG. 11 in a mount phase.

Referring now to FIG. 12, therein is shown a plan view of the structure of FIG. 11 in a mount phase. The integrated circuit package system 1100 also includes leads 1210, a die attach layer 1214, a first die 1216, a second die 1218, tie bars 1230, die bonding pads 1234, and a recess channel 1240. The die bonding pads 1234 can be used for electrically connecting the first die 1216 and the second die 1218 to the leads 1210.

The leads 1210 extend from a lead frame perimeter 1232 to near outer edges of the base die paddle 1102. The leads 1210 provide a pre-defined gap 1246 from paddle edges 1244 conforming to manufacturing and technology requirements. The pre-defined gap 1246 provides clearance so that interconnects can establish electrical connections to the leads 1210 having relatively large dimensions and bonding pads on the surfaces of the first die 1216 and the second die 1218.

The recess channel 1240 includes material of the base die paddle 1102 removed such as by an etching process. The material removed from the base die paddle 1102 can result in a surface indentation of the base die paddle 1102 such as the recess channel 1240. The recess channel 1240 is optional although the recess channel 1240 can be compatible with isolation processes such as partial saw isolation or partial hole drilling. The recess channel 1240 can be formed at a predetermined location based on references such as the lead frame perimeter 1232, the edges of the base die paddle 1102, or the outer encapsulant edges 1122 of FIG. 11.

The tie bars 1230 can structurally connect the lead frame perimeter 1232 to the base die paddle 1102 during processing. The recess channel 1240 can provide an area of reduced material thickness, which can simplify the separation process of the first die attach segment 1106 or the second die attach segment 1108 of the base die paddle 1102.

Figure 13:
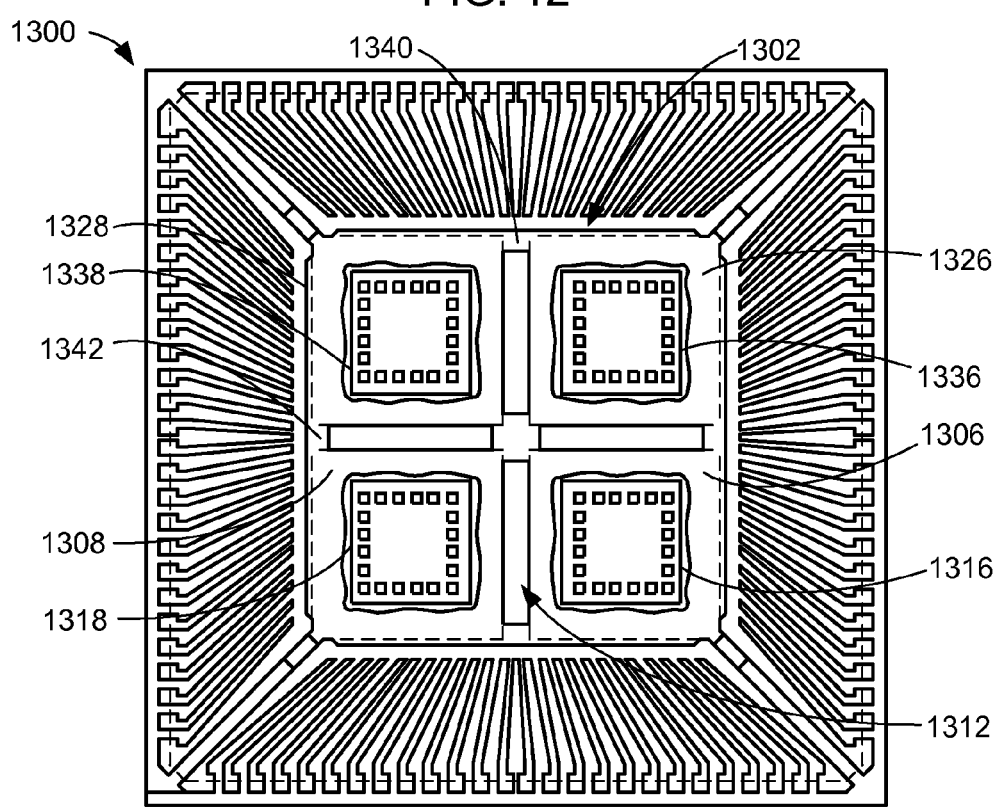
FIG. 13 is a plan view of an integrated circuit package system in a mount phase of a sixth embodiment of the present invention.

Referring now to FIG. 13, therein is shown a plan view of an integrated circuit package system 1300 in a mount phase of a sixth embodiment of the present invention. The integrated circuit package system 1300 preferably includes a base die paddle 1302 having a first die attach segment 1306, a second die attach segment 1308, a third die attach segment 1326, and a fourth die attach segment 1328. The base die paddle 1302 can also include a first recess channel 1340 and a second recess channel 1342 having channel openings 1312 such as perforations or slots.

A first die 1316, a second die 1318, a third die 1336, and a fourth die 1338 can be attached or mounted over the base die paddle 1302. The first recess channel 1340 and the second recess channel 1342 can be formed as isolation cut lines to separate the first die attach segment 1306, the second die attach segment 1308, the third die attach segment 1326, or the fourth die attach segment 1328 providing individual die mounting regions of the base die paddle 1302.

The first recess channel 1340 and the second recess channel 1342 can provide an area of reduced material thickness for simplifying an isolation process such as sawing, drilling, chemical etching, or laser cutting. The isolation process can be applied across a width of the base die paddle 1302 or over regions predetermined to provide electrical isolation for the first die attach segment 1306, the second die attach segment 1308, the third die attach segment 1326, or the fourth die attach segment 1328.

The first recess channel 1340 or the second recess channel 1342 are optional although the first recess channel 1340 and the second recess channel 1342 can enable isolation processes such as partial saw isolation or partial hole drilling. For illustrative purposes, the first recess channel 1340 or the second recess channel 1342 are shown across a length of the base die paddle 1302 from one edge to another opposite and substantially parallel edge although it is understood that any number or shape may be used.

For example, the isolation process can optionally include a saw cut applied near one edge of the integrated circuit package system 1300 to another opposite and substantially parallel edge. The process can include a predetermined depth of the saw cut for electrical isolation of the first die attach segment 1306, the second die attach segment 1308, the third die attach segment 1326, or the fourth die attach segment 1328 of the base die paddle 1302.

Figure 14:
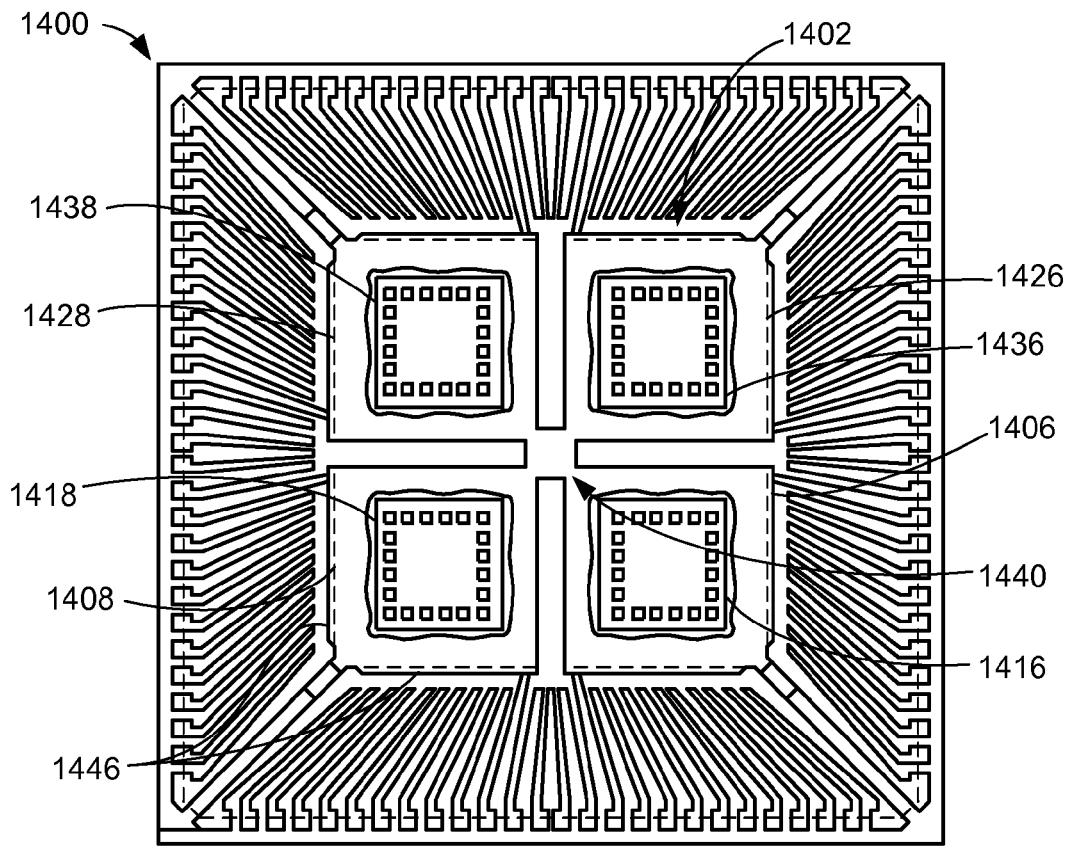
FIG. 14 is a plan view of an integrated circuit package system in a mount phase of a seventh embodiment of the present invention.

Referring now to FIG. 14, therein is shown a plan view of an integrated circuit package system 1400 in a mount phase of a seventh embodiment of the present invention. The integrated circuit package system 1400 preferably includes a base die paddle 1402 having a first die attach segment 1406, a second die attach segment 1408, a third die attach segment 1426, and a fourth die attach segment 1428. The base die paddle 1402 can also include a die paddle support 1440 such as die paddle support joint.

A first die 1416, a second die 1418, a third die 1436, and a fourth die 1438 can be attached or mounted over the base die paddle 1402. The die paddle support 1440 can separate the first die attach segment 1406, the second die attach segment 1408, the third die attach segment 1426, or the fourth die attach segment 1428 providing individual die mounting regions of the base die paddle 1402. The die paddle support 1440 can be recessed or full thickness.

The die paddle support 1440 can provide an area of reduced material thickness for simplifying an isolation process such as sawing, drilling, chemical etching, or laser cutting. The isolation process can be applied across a width of the base die paddle 1402 or over regions predetermined to provide electrical isolation for the first die attach segment 1406, the second die attach segment 1408, the third die attach segment 1426, or the fourth die attach segment 1428.

The die paddle support 1440 is optional although the die paddle support 1440 can enable isolation processes such as partial saw isolation or partial hole drilling. For illustrative purposes, the die paddle support 1440 is shown in a region between the first die attach segment 1406, the second die attach segment 1408, the third die attach segment 1426, and the fourth die attach segment 1428 although it is understood that any number or shape may be used.

For example, the isolation process can optionally include a saw cut applied near one edge of the integrated circuit package system 1400 to another opposite and substantially parallel edge as an isolation cut line. The process can include a predetermined depth of the saw cut for electrical isolation of the first die attach segment 1406, the second die attach segment 1408, the third die attach segment 1426, or the fourth die attach segment 1428 of the base die paddle 1402.

Also for example, the isolation process can optionally include a drill applied over the die paddle support 1440 as an isolation point or region of the base die paddle 1402. The process can include a predetermined depth of the drill or drill gang for electrical isolation of the first die attach segment 1406, the second die attach segment 1408, the third die attach segment 1426, or the fourth die attach segment 1428 of the base die paddle 1402.

Figure 15:
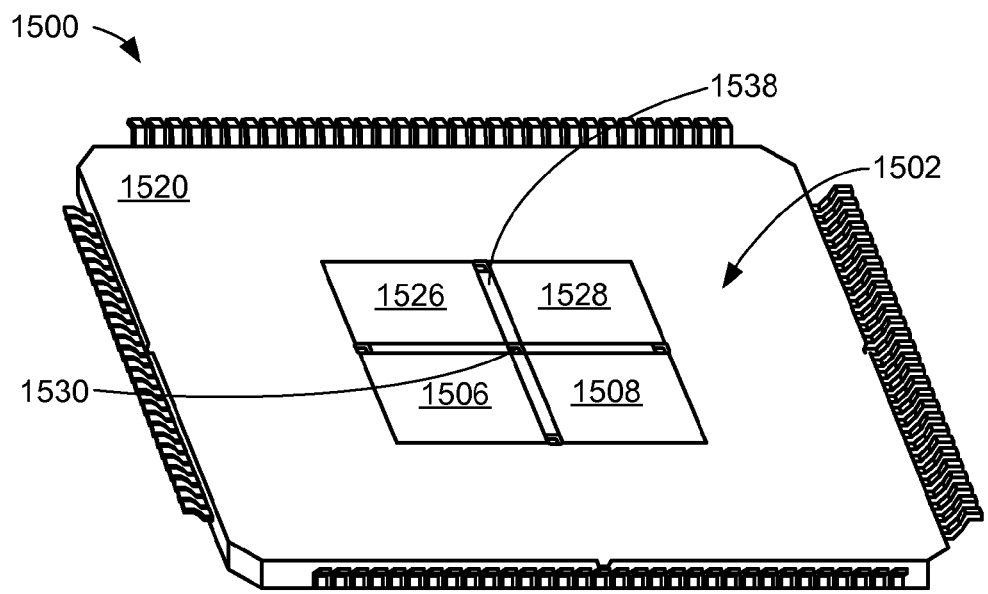
FIG. 15 is a bottom isometric view of an integrated circuit package system in a sixth embodiment of the present invention.

Referring now to FIG. 15, therein is shown a bottom isometric view of an integrated circuit package system 1500 in a sixth embodiment of the present invention. The integrated circuit package system 1500 preferably includes a base die paddle 1502 having a first die attach segment 1506, a second die attach segment 1508, a third die attach segment 1526, and a fourth die attach segment 1528. The base die paddle 1502 can also include a die paddle support 1530 such as a support joint.

A first die 1516, a second die 1518, a third die 1536, and a fourth die 1538 can be attached or mounted over the base die paddle 1502. The die paddle support 1530 can separate the first die attach segment 1506, the second die attach segment 1508, the third die attach segment 1526, or the fourth die attach segment 1528 providing individual die mounting regions of the base die paddle 1502. The die paddle support 1530 can be recessed or full thickness.

The die paddle support 1530 can provide an area of reduced material thickness for simplifying an isolation process such as sawing, drilling, chemical etching, or laser cutting. The isolation process can be applied across a width of the base die paddle 1502 or over regions predetermined to provide electrical isolation for the first die attach segment 1506, the second die attach segment 1508, the third die attach segment 1526, or the fourth die attach segment 1528.

The die paddle support 1530 is optional although the die paddle support 1530 can enable isolation processes such as partial saw isolation or partial hole drilling. For illustrative purposes, the die paddle support 1530 is shown in a region between the first die attach segment 1506, the second die attach segment 1508, the third die attach segment 1526, and the fourth die attach segment 1528 although it is understood that any number or shape may be used.

For example, the isolation process can optionally include a saw cut applied near one edge of the integrated circuit package system 1500 to another opposite and substantially parallel edge as an isolation cut line. The process can include a predetermined depth of the saw cut for electrical isolation of the first die attach segment 1506, the second die attach segment 1508, the third die attach segment 1526, or the fourth die attach segment 1528 of the base die paddle 1502.

Also for example, the isolation process can optionally include a drill applied over the die paddle support 1530 as an isolation point or region of the base die paddle 1502. The process can include a predetermined depth of the drill or drill gang for electrical isolation of the first die attach segment 1506, the second die attach segment 1508, the third die attach segment 1526, or the fourth die attach segment 1528 of the base die paddle 1502.

Figure 16:
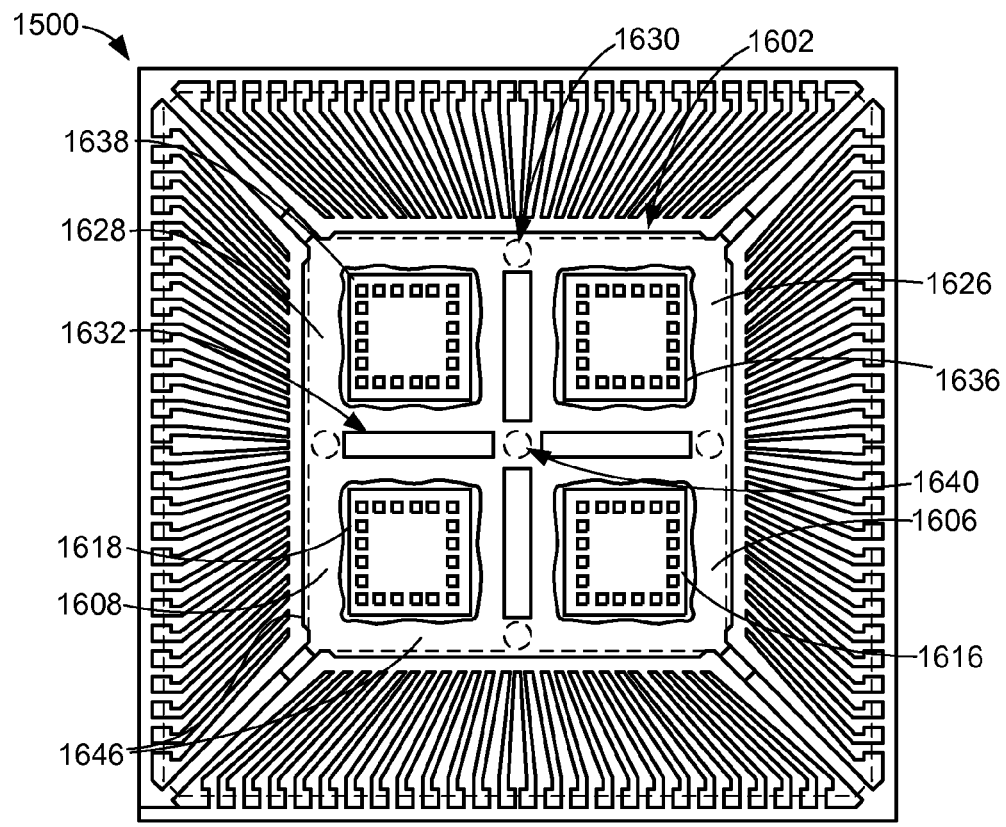
FIG. 16 is a plan view of the structure of FIG. 15 in a mount phase.

Referring now to FIG. 16, therein is shown a plan view of the structure of FIG. 15 in a mount phase. The integrated circuit package system 1500 preferably includes a base die paddle 1602 having a first die attach segment 1606, a second die attach segment 1608, a third die attach segment 1626, and a fourth die attach segment 1628. The base die paddle 1602 can also include edge supports 1630 having channel openings 1632 such as perforations or slots.

A first die 1616, a second die 1618, a third die 1636, and a fourth die 1638 can be attached or mounted over the base die paddle 1602. A center support 1640 can separate the first die attach segment 1606, the second die attach segment 1608, the third die attach segment 1626, or the fourth die attach segment 1628 providing individual die mounting regions of the base die paddle 1602.

The edge supports 1630 can provide an area of reduced material thickness for simplifying an isolation process such as sawing, drilling, chemical etching, or laser cutting. The isolation process can be applied across a width of the base die paddle 1602 or over regions predetermined to provide electrical isolation for the first die attach segment 1606, the second die attach segment 1608, the third die attach segment 1626, or the fourth die attach segment 1628.

The edge supports 1630 are optional although the edge supports 1630 can enable isolation processes such as partial saw isolation or partial hole drilling. For illustrative purposes, the edge supports 1630 are shown formed in predetermined positions or locations although it is understood that any position or location may be used.

For example, the isolation process can optionally include a drill applied over the edge supports 1630 as isolation point or regions of the base die paddle 1602. The process can include a predetermined depth of the drill or drill gang for electrical isolation of the first die attach segment 1606, the second die attach segment 1608, the third die attach segment 1626, or the fourth die attach segment 1628 of the base die paddle 1602.

Figure 17:
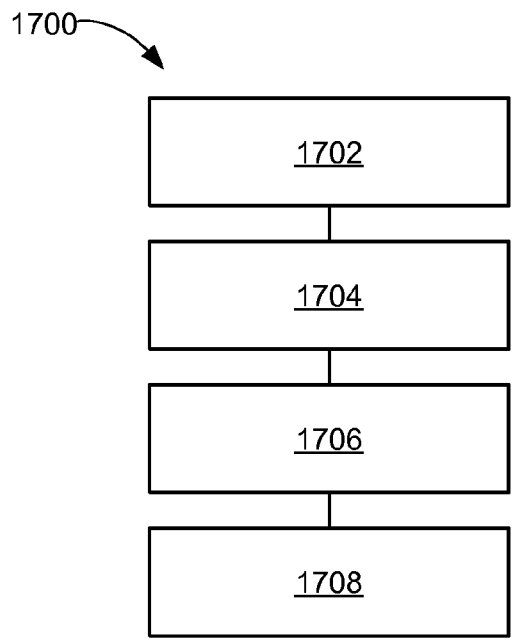
FIG. 17 is a flow chart of an integrated circuit package system for manufacturing the integrated circuit package system in an embodiment of the present invention.

Referring now to FIG. 17, therein is shown a flow chart of an integrated circuit package system 1700 for manufacturing the integrated circuit package system 100 in an embodiment of the present invention. The system 1700 includes providing die in a block 1702; forming leads adjacent the die in a block 1704; forming a die paddle adjacent the leads with the die thereover in a block 1706; and forming a cavity for isolating one of the die and a die attach segment of the die paddle in a block 1708.

In greater detail, a system to provide the method and apparatus of the integrated circuit package system 100, in an embodiment of the present invention, is performed as follows:

1. Providing integrated circuit die.
2. Forming leads adjacent outer edges of the integrated circuit die.
3. Forming a base die paddle adjacent the leads wherein one of the integrated circuit die is adjacent another of the integrated circuit die over the base die paddle.
4. Forming a die paddle cavity for isolating each of the integrated circuit die and die attach segments of the base die paddle.

Thus, it has been discovered that the method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacture of an integrated circuit package system comprising:
   providing a die paddle having a cavity to a predetermined depth in the die paddle for electrically isolating a first die attach segment and a second die attach segment of the die paddle;
   forming a plurality of leads adjacent the die paddle;
   attaching a first die to the first die attach segment and connected to at least some of the plurality of leads; and
   attaching a second die to the second die attach segment and connected to at least some of the plurality of leads.

2. The method as claimed in claim 1 wherein forming the cavity includes forming an encapsulant cavity over a die paddle cavity.

3. The method as claimed in claim 1 wherein forming the die paddle includes forming a die paddle support for isolating the die attach segment of the die paddle.

4. The method as claimed in claim 1 wherein forming the die paddle includes forming an isolation cut line.

5. The method as claimed in claim 1 wherein forming the die paddle includes forming an isolation region.

6. A method for manufacture of an integrated circuit package system comprising:
   providing a first and a second integrated circuit die;
   forming leads adjacent outer edges of the integrated circuit die;
   forming a base die paddle adjacent the leads wherein the first integrated circuit die is adjacent the second integrated circuit die over the base die paddle; and
   forming a die paddle cavity to a predetermined depth in the base die paddle for electrically isolating a first and a second die attach segment in the die attach paddle for isolating each of the integrated circuit die attached to each of the die attach segments of the base die paddle.

7. The method as claimed in claim 6 wherein forming the die paddle cavity includes etching the base die paddle for isolation.

8. The method as claimed in claim 6 wherein forming the die paddle cavity includes sawing the base die paddle for isolation.

9. The method as claimed in claim 6 wherein forming the die paddle cavity includes laser cutting the base die paddle for isolation.

10. The method as claimed in claim 6 wherein forming the die paddle cavity includes drilling the base die paddle with a ganged drill apparatus.

11. An integrated circuit package system comprising:
    a die paddle having a cavity to a predetermined depth in the die paddle for electrically isolating a first die attach segment and a second die attach segment of the die paddle;
    a plurality of leads adjacent the die paddle;
    a first die attached to the first die attach segment and connected to at least some of the plurality of leads; and
    a second die attached to the second die attach segment and connected to at least some of the plurality of leads.

12. The system as claimed in claim 11 wherein the cavity includes an encapsulant cavity over a die paddle cavity.

13. The system as claimed in claim 11 wherein the die paddle includes a die paddle support for isolating the die attach segment of the die paddle.

14. The system as claimed in claim 11 wherein the die paddle includes an isolation cut line.

15. The system as claimed in claim 11 wherein the die paddle includes an isolation region.

16. The system as claimed in claim 11 wherein:
    the die are integrated circuit die;
    the leads are adjacent outer edges of the integrated circuit die; and
    the die paddle is a base die paddle adjacent the leads with the first integrated circuit die adjacent the second integrated circuit die over the base die paddle.

17. The system as claimed in claim 16 further comprising an encapsulant having opposite outer encapsulant edges with the cavity extending thereto.

18. The system as claimed in claim 16 wherein the die paddle having the cavity includes the die paddle having a first cavity intersecting a second cavity.

19. The system as claimed in claim 16 further comprising an encapsulant partially exposing the first die attach segment and the second die attach segment.

20. The system as claimed in claim 16 further comprising an encapsulant partially covering the first die attach segment and the second die attach segment.

* * * * *

UNITED STATES PATENT AND TRADEMARK OFFICE
CERTIFICATE OF CORRECTION

PATENT NO. : 8,067,825 B2
APPLICATION NO. : 11/863700
DATED : November 29, 2011
INVENTOR(S) : Advincula et al.

It is certified that error appears in the above-identified patent and that said Letters Patent is hereby corrected as shown below:

Column 2:
line 50, add double dashes between numbers 1-1 as follows: delete "line 1-1 of FIG. 2," and insert therefor --line 1--1 of FIG. 2,-- line 57, add double dashes between numbers 4-4 as follows: delete "line 4-4 of FIG. 3;" and insert therefor --line 4--4 of FIG. 3;--

Column 4:
line 5, add double dashes between numbers 1-1 as follows: delete "line 1-1 of FIG. 2," and insert therefor --line 1--1 of FIG. 2,-- line 52, delete "of the encansulant 120, the first" and insert therefor --of the encapsulant 120, the first--

Column 5:
lines 64-65, add double dashes between numbers 4-4 as follows: delete "line 4-4 of FIG. 3." and insert therefor --line 4--4 of FIG. 3.--

Signed and Sealed this
Ninth Day of October, 2012

David J. Kappos
*Director of the United States Patent and Trademark Office*